(12) United States Patent
Liaw

(10) Patent No.: US 6,326,240 B1
(45) Date of Patent: Dec. 4, 2001

(54) APPARATUS FOR PACKAGING SEMICONDUCTOR DEVICE AND METHOD FOR PACKAGING THE SAME

(75) Inventor: Been Yu Liaw, Tai-Chung (TW)

(73) Assignee: World Wiser Electronics Inc., Taoyuan Hsien (TW)

( * ) Notice: Subject to any disclaimer, the term of this patent is extended or adjusted under 35 U.S.C. 154(b) by 0 days.

(21) Appl. No.: 09/250,630

(22) Filed: Feb. 16, 1999

(30) Foreign Application Priority Data

Dec. 31, 1998 (TW) .................................................. 87121967

(51) Int. Cl.⁷ ...................................................... H01L 21/44
(52) U.S. Cl. ............................ 438/113; 438/112; 438/127
(58) Field of Search ..................................... 438/107, 110, 438/112, 113, 124, 125, 126, 127

(56) References Cited

U.S. PATENT DOCUMENTS

| | | | | |
|---|---|---|---|---|
| 5,729,437 | * | 3/1998 | Hashimoto | 438/126 |
| 5,776,798 | * | 7/1998 | Quan et al. | 438/460 |
| 5,973,263 | * | 10/1999 | Tuttle et al. | 257/790 |
| 5,989,982 | * | 11/1999 | Yoshikazu | 438/113 |
| 5,990,545 | * | 11/1999 | Schueller et al. | 257/697 |
| 6,087,202 | * | 7/2000 | Exposito | 438/113 |
| 6,093,584 | * | 7/2000 | Fjeistad | 438/127 |
| 6,228,676 | * | 5/2001 | Glenn et al. | 438/124 |

* cited by examiner

*Primary Examiner*—Kevin M. Picardat
(74) *Attorney, Agent, or Firm*—Jiawei Huang; J.C. Patents

(57) ABSTRACT

An apparatus for packaging a semiconductor device and a method for packaging the same. The apparatus includes a closed printing chamber having a baseplate on the bottom of the closed printing chamber. A pressure controlling system is connected to the closed printing chamber. The baseplate includes a heating unit. A paste source tank is located in the closed printing chamber.

17 Claims, 4 Drawing Sheets

APPARATUS FOR PACKAGING SEMICONDUCTOR DEVICE AND METHOD FOR PACKAGING THE SAME

CROSS-REFERENCE TO RELATED APPLICATION

This application claims the priority benefit of Taiwan application serial no. 87121967, filed Dec. 31, 1998, the full disclosure of which is incorporated herein by reference.

BACKGROUND OF THE INVENTION

1. Field of the Invention

The present invention relates to an apparatus and a method for packaging a semiconductor device. More particularly, the present invention relates to an apparatus and an improved method for a glob top packaging process.

2. Description of the Related Art

A liquid encapsulant and dam materials are used in various packaging technologies in a dispensing process. The process is widely used in chip-on-board (COB), flip chip (FC), ball grid array (BGA), chip scale package (CSP) and multi-chip module (MCM).

The dispensing process has to apply dam materials on the edge of a desired encapsulation area and a low-viscosity encapsulant material is applied on the top of the chip. The dispensing process is sequential processes, in which first the dam materials and then the encapsulation material and applied on each chip, one by one, to complete the process.

The current dispensing process has a low throughput and voids. Because the current process is performed at atmospheric pressure, air is easily mixed into the encapsulation material, and, as a result, voids are easily formed in the packages. These voids are decrease the reliability of the packages. Additionally, because the technology is split into two steps, it is difficult to increase the throughput. Moreover, the dam material increases manufacturing costs.

SUMMARY OF THE INVENTION

Accordingly, the present invention provides an apparatus and a method for packaging a semiconductor device that increases the reliability and the throughput of packages, and decreases manufacturing costs.

To achieve these and other advantages and in accordance with the purpose of the invention, as embodied and broadly described herein, the invention provides an apparatus for packaging a semiconductor device. The apparatus includes a closed printing chamber having a baseplate on the bottom of the closed printing chamber. A pressure controlling system is connected to the closed printing chamber. The baseplate includes a heating unit. A paste source tank is located in the closed printing chamber.

To achieve these and other advantages and in accordance with the purpose of the invention, as embodied and broadly described herein, the invention provides a method for packaging a semiconductor device. The method includes the following steps. A baseplate located on the bottom of a closed printing chamber is provided. A device and a stencil having a mesh are mounted on the baseplate. The device is located within the mesh. An amount of preheated paste is placed on the stencil. A pressure of the closed printing chamber is adjusted to a first pressure. A printing step is performed to fill the mesh with the paste and cover the device. The pressure of the closed printing chamber is adjusted to a second pressure to remove voids trapped in the plugs. The pressure of the closed printing chamber is adjusted to a third pressure. A scraping step is performed to remove the redundant paste.

In the invention, the encapsulation area is defined by a mesh so that there is no need for the dam material. The process is performed in one step. The throughput is increased and the manufacturing costs are decreased. Because the process is performed in a vacuum, the problem of voids is avoided and the packages are more reliable.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
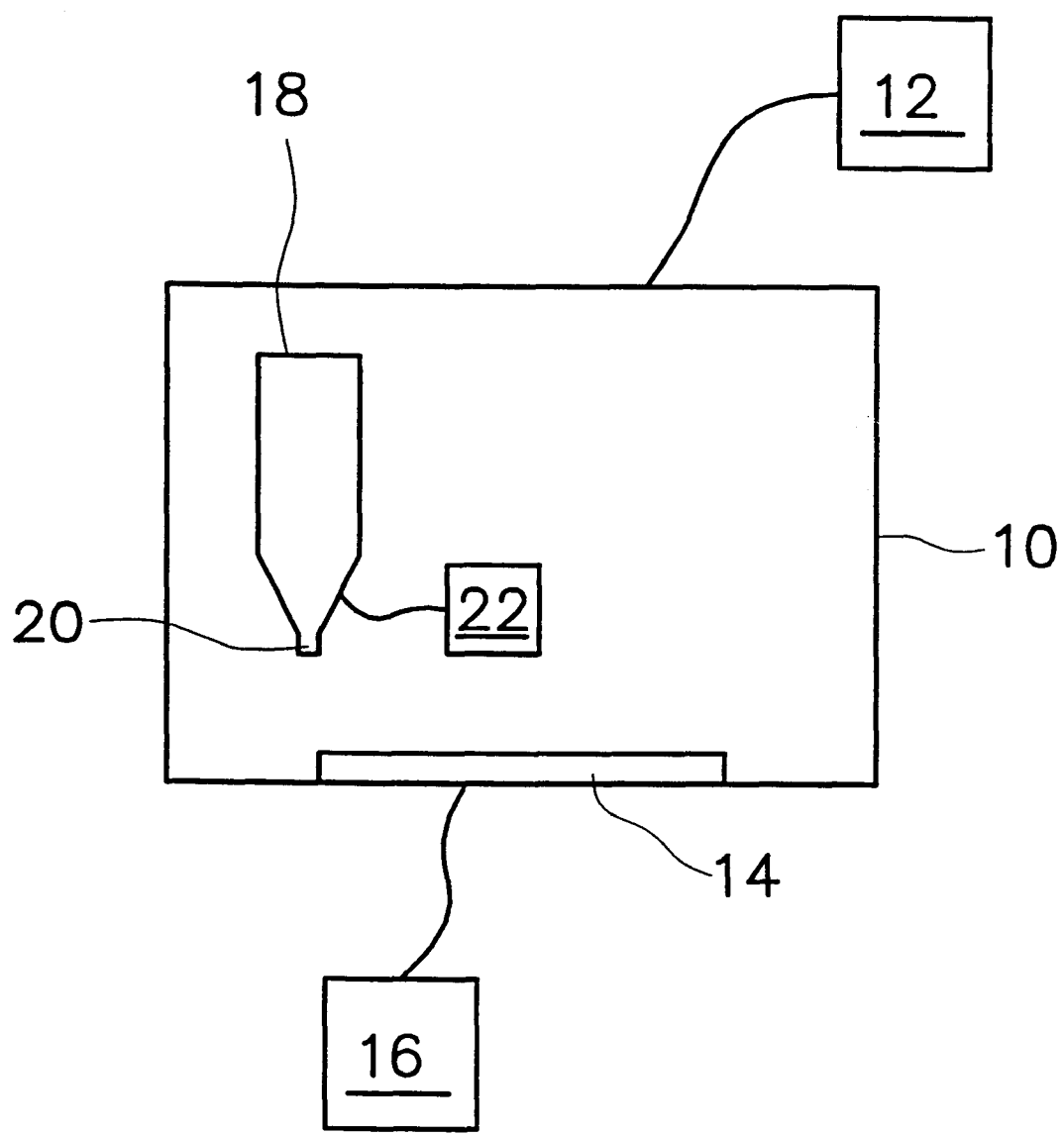
FIG. 1 is a schematic diagram showing an apparatus for manufacturing a plug according to the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram showing an apparatus for manufacturing a plug according to the invention.

Referring to FIG. 1, a closed printing chamber 10 is provided. The closed printing chamber 10 is an operation region in which a printed circuit board is printed. The closed printing chamber 10 is connected to a pressure control system 12 which controls the pressure in the closed printing chamber 10. A baseplate 14 having a heating unit 16 is located on the bottom of the closed printing chamber 10. The baseplate 14 is used as a mounting surface for a printed circuit board. The heating unit 16 is used for heating the paste on the printed circuit board mounted on the baseplate 14 during a printing step. A paste source tank 18 for providing paste is located inside the closed printing chamber 10. A heating unit located near an outlet opening 20 of the paste source tank 18 is used for heating the paste to reduce its viscosity.

FIGS. 2A through 2E are schematic, cross-sectional views showing the process steps according to the invention for manufacturing a plug.

Figure 2A:
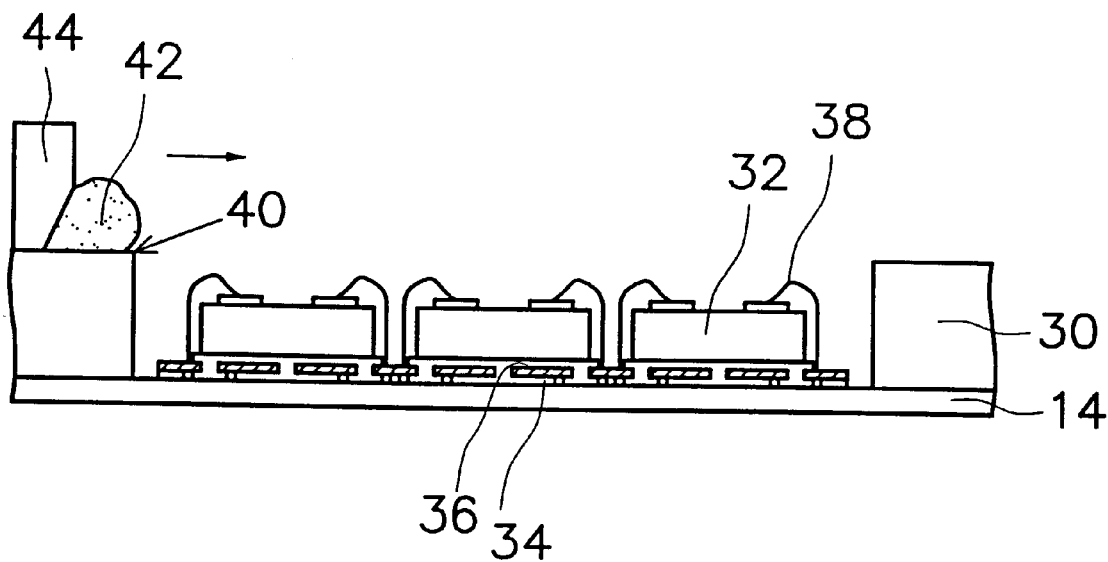
FIGS. 2A through 2E are schematic, cross-sectional views showing the process steps according to the invention for manufacturing a plug.

Referring to FIG. 2A, chips 32 are attached to carriers 34 respectively by a material 36 such as epoxy or conducting paste. The chips 32 are electrically coupled to the carriers 34 by conducting wires 38. The carriers 34 include a printed circuit board or a ball grid array substrate. In the embodiment, the carriers 34 are ball grid array substrates. The step of coupling the chips 32 and the carriers 34 includes wire bonding, tape automatic bonding or flip chip.

The chips 32 and the carriers 34 are placed on a baseplate 14 located in a closed printing chamber (as reference numeral 10 shown in FIG. 1). A stencil 30 is placed on the baseplate 14, and the chips 32 and the carriers 34 are located within a mesh 40 of the stencil 30. An amount of a preheated paste 42 is placed on the stencil 30. A preferred amount of the paste 42 is sufficient for one or two performances of a printing step. The paste 42 is preheated to a temperature of about 40 to 90° C. before it is applied on the stencil 30. The closed printing chamber is pumped down to about 0.01 to 5 Torr, and then a printing step is performed. The paste 42 is heated to a temperature of about 50 to 120° C. by the heating unit of the baseplate 14 (as reference numeral 16 shown in FIG. 1) during the printing step. A squeegee 44 is used to print the paste 42. The paste 42 fills the mesh 40 and covers the chips 32 and the carriers 34.

The purpose of preheating the paste 42 is to reduce the viscosity of the paste 42. The purpose of heating the paste 42 during the printing step is the same. The heating temperature depends on the material of the paste 64, and it should be just sufficient to reduce the viscosity but not high enough to cause thermally cure the paste 42. Thus, a constant viscosity of the paste 42 is maintained for each printing step.

In the invention, the encapsulation area of the chips 32 is defined by the mesh 40, not the dam material. The manufacturing costs are decreased. Additionally, since a plurality of chips is placed in one mesh, the throughput is increased. Further, one chip in one mesh is also suitable.

Figure 2B:
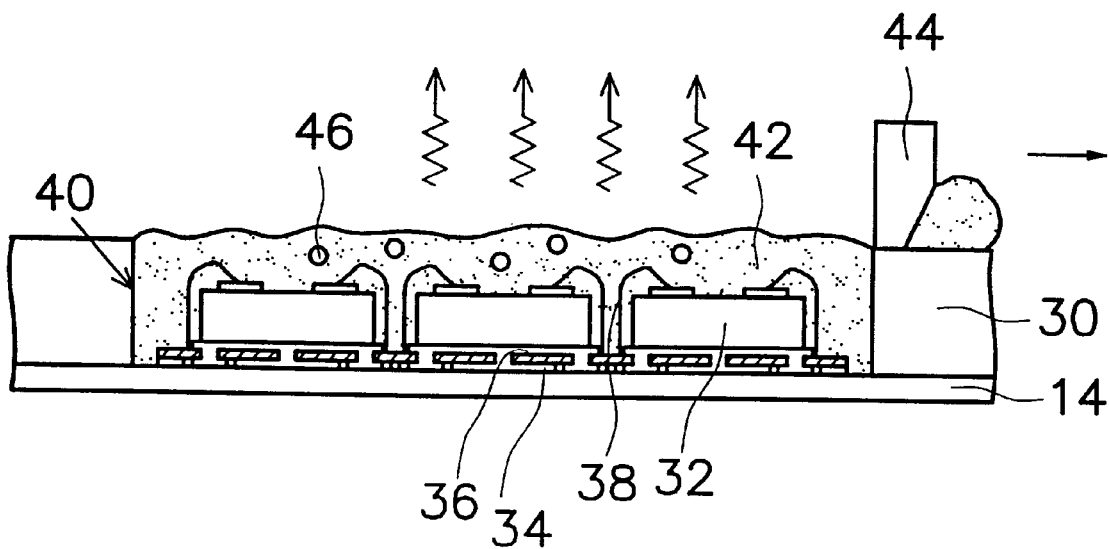

Referring to FIG. 2B, bubbles 46 are formed because of the viscosity of the paste 42 or the flow of the paste 42. To make sure the bubbles 46 are completely removed, the closed printing chamber is pressurized with air to about 350 to 1000 Torr so as to introduce a positive pressure. Thus, the bubbles 46 are moved to the surface of the paste 42 and broken due to the positive pressure. The positive pressure also helps to densify the paste 42. The process mentioned above is suitable for a low viscous paste whose viscosity is about 200 to 300 Pa·s.

For very high viscous paste 42 whose viscosity is about 600 to 1000 Pa·s, the positive pressure is about 0.5 to 2.0 Kg/cm² to make removal of the bubbles 46 trapped in the paste 42 more efficient. Furthermore, if necessary, the period of time for which the positive pressure is applied can be increased to eliminate the bubbles 46.

Figure 2C:
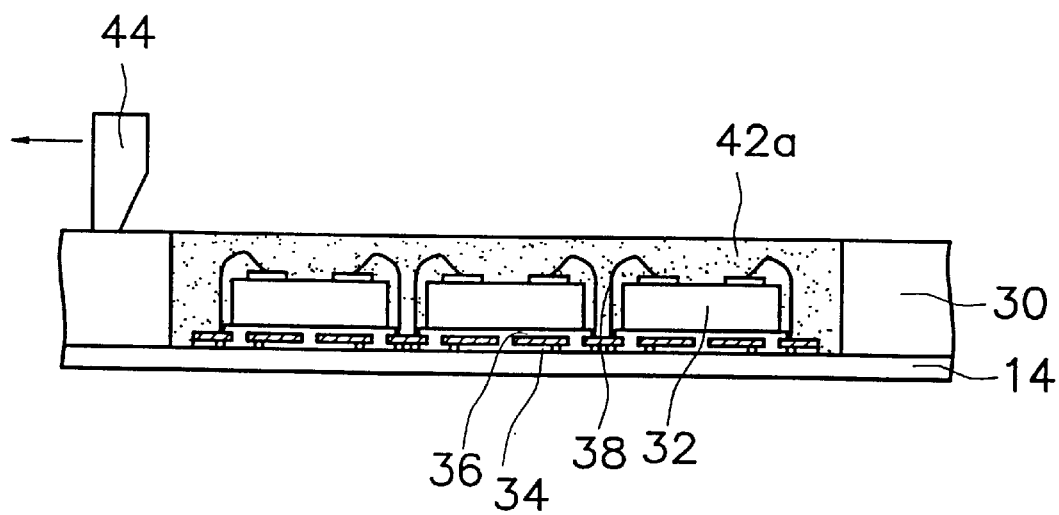

Referring to FIG. 2C, the closed printing chamber is pumped down to about 5 to 20 Torr. The squeegee 44 is used to scrape the paste 42. Thus, the redundant paste 42 is removed and the surface uniformity of the paste 42a is improved.

Figure 2D:
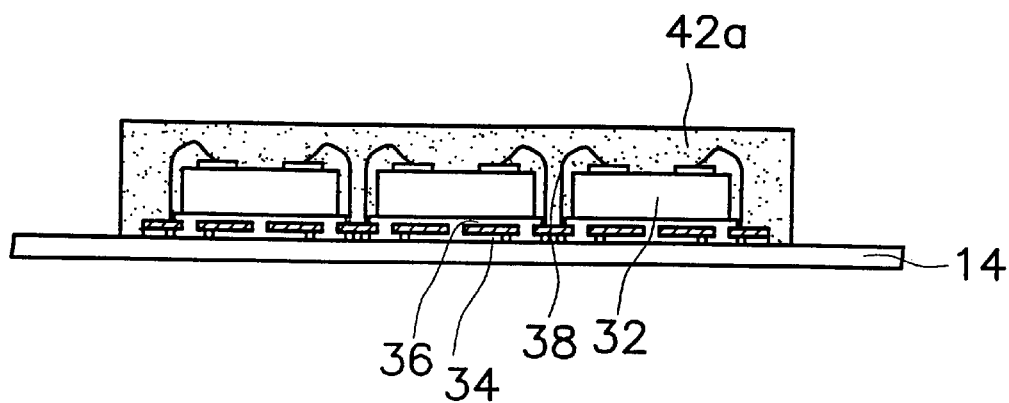

Referring to FIG. 2D, the stencil 30 is removed and the closed printing chamber is returned to atmospheric pressure.

Figure 2E:
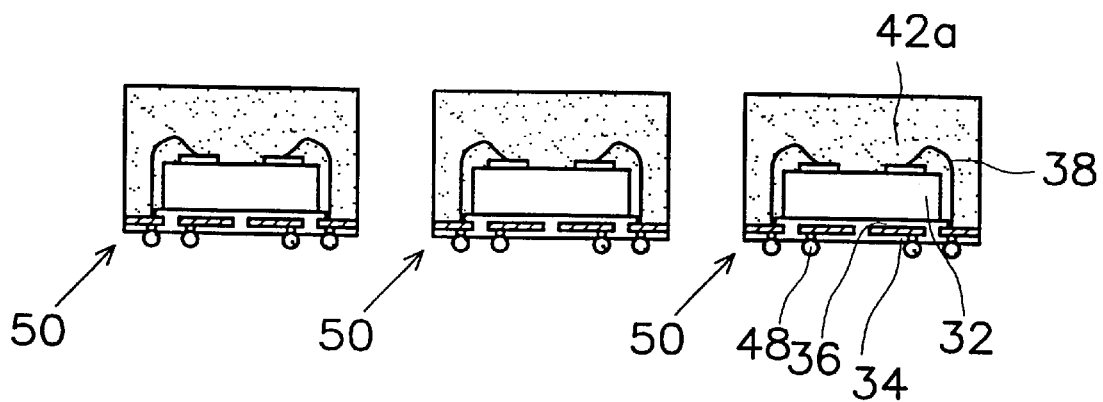

Referring to FIG. 2E, the paste 42a is cured and tin balls are soldered onto the carriers 34, the individual packages are split apart. Thus, each package 50 includes a chip 32 and a carrier 34.

Figure 3:
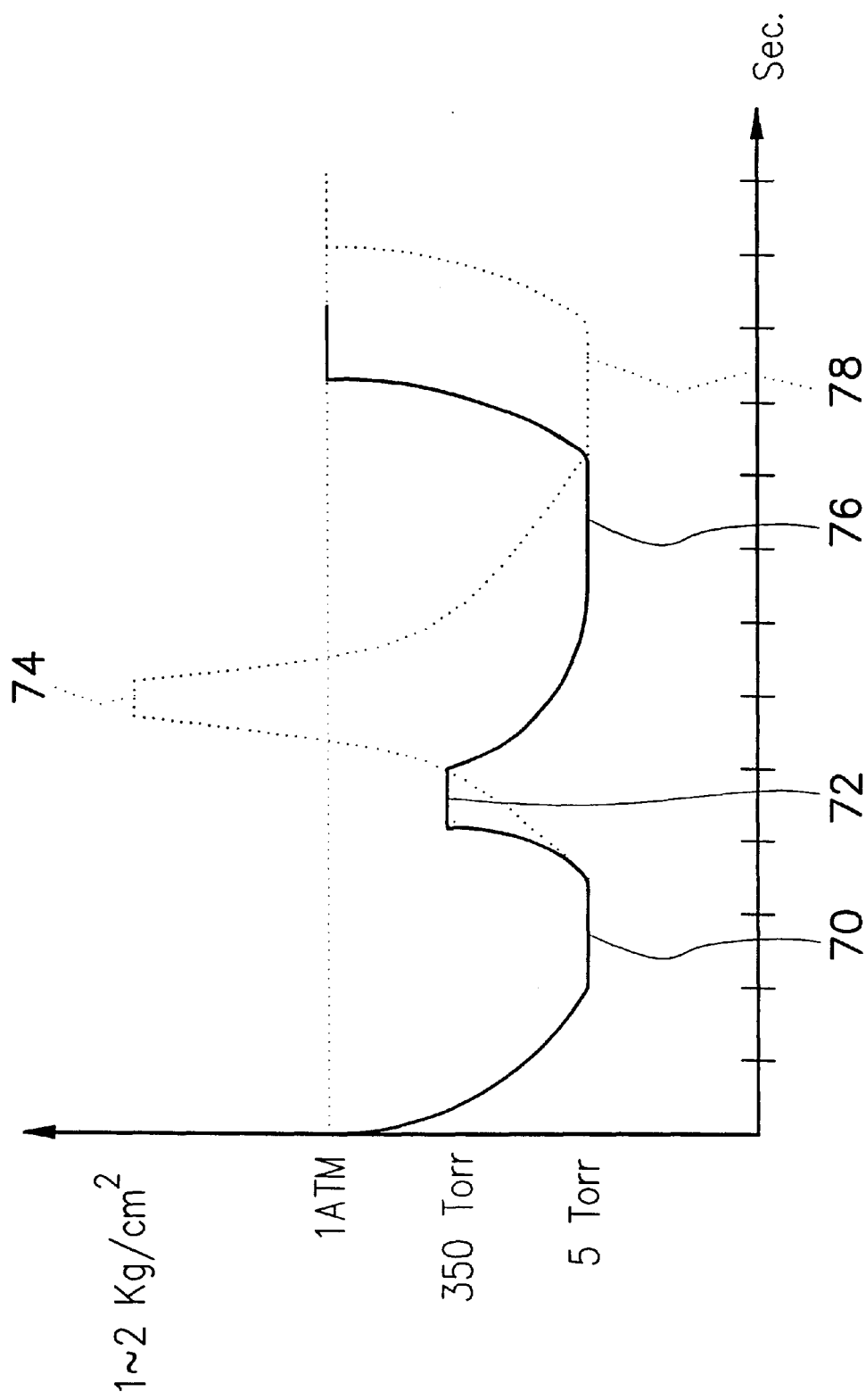
FIG. 3 is a schematic diagram showing the relationship between time and pressure in the manufacturing process of FIGS. 2A through 2E according to the invention.

FIG. 3 is a schematic diagram showing the relationship between time and pressure in the manufacture process illustrated in FIGS. 2A through 2E according to the invention.

Referring to FIG. 3, the closed printing chamber is pumped down to about 0.01 to 5 Torr (reference numeral 70 shown in FIG. 3), and the printing step is performed. To make sure the bubbles trapped in the plug are completely removed to densify the paste, the closed printing chamber is pressurized with air to about 350 to 1000 Torr (reference numeral 72 shown in FIG. 3) to introduce a positive pressure. Thus, the bubbles are forced to the surface of the plug and broken due to the positive pressure. The closed printing chamber is pumped down to about 5 to 20 Torr (reference numeral 76 shown in FIG. 3). The squeegee is used to remove the redundant paste and ensure the surface uniformity of the plug. The process mentioned above is suitable for a low viscous paste whose viscosity is about 200 to 300 Pa·s.

For very high viscous paste whose viscosity is about 600 to 1000 Pa·s, the positive pressure is applied to about 0.5 to 2.0 Kg/cm² (reference numeral 74 shown in FIG. 4) so that the removal of the bubbles trapped in the plug is more efficient. The printing chamber is them pumped down to about 5 to 20 Torr (reference numeral 78 shown in FIG. 4). The squeegee is used to remove the redundant paste and ensure the surface uniformity of the plug.

According to the foregoing, the advantages of the invention include the following:

1. The present invention provides an apparatus for packaging a semiconductor device that is operated under a vacuum so that the problem of forming voids in the packages is avoided and the reliability of the packages is improved.

2. In the invention, the method for packaging a semiconductor device is operated under a vacuum. The encapsulation area is defined by the stencil, thus replacing the dam material. As a result, the manufacturing costs are reduced and the throughput is increased because the process is performed in one step.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for packaging a semiconductor device, wherein a chip is attached to a carrier and electrically coupled to the carrier, comprising the steps of:

providing a closed printing chamber having a baseplate;

mounting the carrier and a stencil having a mesh in sequence on the baseplate, wherein the carrier is located in the mesh;

placing a preheated paste on the stencil;

adjusting a pressure in the closed printing chamber to a first pressure to perform a printing step for filling the mesh with paste and covering the carrier;

adjusting the pressure in the closed printing chamber to a second pressure; and adjusting the pressure in the closed printing chamber to a third pressure to perform a scraping step for removing the redundant paste.

2. The method of claim 1, wherein the paste is heated by the baseplate during the printing step and the scratching step.

3. The method of claim 1, wherein the paste is heated to a temperature of about 50 to 120° C.

4. The method of claim 1, wherein the preheated temperature of the paste is about 40 to 90° C.

5. The method of claim 1, wherein the first pressure is about 0.01 to 5 Torr.

6. The method of claim 1, wherein the second pressure is about 350 to 1000 Torr when the viscosity of the paste is about 200 to 300 Pa·s.

7. The method of claim 1, wherein the second pressure is about 0.5 to 2 Kg/cm² when the viscosity of the paste is about 600 to 1000 Pa·s.

8. The method of claim 1, wherein the third pressure is about 5 to 20 Torr.

9. A method for packaging a semiconductor device, wherein a plurality of chips is attached to a plurality of carriers, respectively, and electrically coupled to the carriers, comprising the steps of:

providing a closed printing chamber having a baseplate;

mounting the carriers and a stencil having a mesh in sequence on the baseplate, wherein the carriers are located in the mesh;

placing a preheated paste on the stencil;

adjusting a pressure in the closed printing chamber to a first pressure to perform a printing step for filling the mesh with paste and covering the carriers;

adjusting the pressure in the closed printing chamber to a second pressure; and adjusting the pressure in the closed printing chamber to a third pressure to perform a scraping step for removing the redundant paste.

10. The method of claim 9, wherein the paste is heated by the baseplate during the printing step and the scratching step.

11. The method of claim 10, wherein the paste is heated to a temperature of about 50 to 120° C.

12. The method of claim 9, wherein the preheated temperature of the paste is about 40 to 90° C.

13. The method of claim 9, wherein the first pressure is about 0.01 to 5 Torr.

14. The method of claim 9, wherein the second pressure is about 350 to 1000 Torr when the viscosity of the paste is about 200 to 300 Pa·s.

15. The method of claim 9, wherein the second pressure is about 0.5 to 2 Kg/cm$^2$ when the viscosity of the paste if about 600 to 1000 Pa·s.

16. The method of claim 9, wherein the third pressure is about 5 to 20 Torr.

17. The method of claim 9, further comprising the steps of:

removing the stencil;

curing the paste; and splitting to form individual semiconductor packages.

* * * * *